United States Patent
Nishihara et al.

(10) Patent No.: US 7,271,684 B2
(45) Date of Patent: Sep. 18, 2007

(54) FILTER ELEMENT, AND FILTER DEVICE, DUPLEXER, AND HIGH-FREQUENCY CIRCUIT EACH INCLUDING SAID FILTER ELEMENT

(75) Inventors: Tokihiro Nishihara, Kawasaki (JP); Tsuyoshi Yokoyama, Kawasaki (JP); Takeshi Sakashita, Kawasaki (JP); Tsutomu Miyashita, Kawasaki (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 30 days.

(21) Appl. No.: 10/717,487

(22) Filed: Nov. 21, 2003

(65) Prior Publication Data

US 2004/0100342 A1    May 27, 2004

(30) Foreign Application Priority Data

Nov. 22, 2002    (JP)    ............... 2002-339611

(51) Int. Cl.
*H03H 9/70*    (2006.01)
*H03H 9/54*    (2006.01)

(52) U.S. Cl. ..................... 333/133; 333/189

(58) Field of Classification Search ........ 333/186–196, 333/133
See application file for complete search history.

(56) References Cited

U.S. PATENT DOCUMENTS 2,452,114 A * 10/1948 Farkas ................. 333/190
2,980,872 A * 4/1961 Storch ................. 333/190
5,631,612 A * 5/1997 Satoh et al. ........... 333/193
5,789,845 A * 8/1998 Wadaka et al. ........ 310/334
5,910,756 A * 6/1999 Ella ..................... 333/133
5,942,958 A * 8/1999 Lakin ................... 333/189
6,262,637 B1 * 7/2001 Bradley et al. ........ 333/133
6,344,705 B1 * 2/2002 Solal et al. ........... 310/313 B
6,407,649 B1 * 6/2002 Tikka et al. ........... 333/133
6,486,751 B1 * 11/2002 Barber et al. .......... 333/187
6,556,103 B2 * 4/2003 Shibata et al. ......... 333/187
6,710,677 B2 * 3/2004 Beaudin et al. ........ 333/133
6,741,145 B2 * 5/2004 Tikka et al. ........... 333/133

FOREIGN PATENT DOCUMENTS

| JP | 10-303698 | | 11/1998 |
|---|---|---|---|
| JP | 11-312951 | * | 11/1999 |
| JP | 2000-077972 | * | 3/2000 |
| JP | 2001-24476 | | 1/2001 |
| JP | 2002-198777 | | 7/2002 |
| JP | 2002-217676 | * | 8/2002 |
| JP | 2002-237738 | | 8/2002 |
| JP | 2003-298392 | * | 10/2003 |
| JP | 2003-332884 | * | 11/2003 |

* cited by examiner

*Primary Examiner*—Barbara Summons
(74) *Attorney, Agent, or Firm*—Arent Fox LLP

(57) ABSTRACT

A filter element includes resonators that are arranged in series arms and parallel arms in a circuit. In this filter element, at least one of the series-arm resonators includes a plurality of single-terminal pair piezoelectric thin-film resonators connected in parallel.

15 Claims, 12 Drawing Sheets

US 7,271,684 B2

FILTER ELEMENT, AND FILTER DEVICE, DUPLEXER, AND HIGH-FREQUENCY CIRCUIT EACH INCLUDING SAID FILTER ELEMENT

BACKGROUND OF THE INVENTION

1. Field of the Invention

The present invention generally relates to a filter element having a piezoelectric thin-film resonator and a filter device including the filter element, and more particularly, to a duplexer and a high-frequency circuit that are required to have high power durability to be used at the front end of a radio terminal.

2. Description of the Related Art

In recent years, wireless terminals such as portable telephones have been rapidly becoming smaller and lighter. In this trend, components for those terminals are expected to become smaller and exhibit higher performance. In duplexers to be used at the front ends of RF circuits, for example, conventional dielectric filters are being replaced with surface acoustic wave (SAW) filters that are much smaller than the conventional dielectric filters.

SAW filters, however, have a drawback in inherently having low power durability, since minute comb-like electrode patterns are used in those SAW filters. So as to increase the power durability of SAW filters, improvements have been made on the electrode materials and designs.

Such SAW filters to be employed in duplexers often include a ladder-type circuit. Hereinafter, those filters having ladder-type circuit structures will be referred to as "ladder filters". In the following, the structure of a ladder filter will be described, with reference to the accompanying drawings.

As shown in FIG. 1, a "base section" of a ladder-type circuit includes a single-terminal pair resonator (a single-terminal pair SAW resonator in a SAW filter, hereinafter referred to simply as a "resonator") in each of a series arm and a parallel arm. In the following description, a resonator arranged in a series arm will be referred to as a "series-arm resonator S", and a resonator arranged in a parallel arm will be referred to as a "parallel-arm resonator P".

A ladder filter has a structure in which two or more "base sections" are connected while image impedance matching is performed between the sections. Hereinafter, each "base section" will be referred to as "one stage". As an example of such a structure, FIG. 2 shows an equivalent circuit diagram of a ladder filter 100 having a four-stage structure. In practice, any two neighboring resonators (series-arm resonators S2 and S3, parallel-arm resonators P1 and P2, and parallel-arm resonators P3 and P4 in FIG. 2) may be combined into one, so as to obtain desired characteristics or to reduce the filter size. FIG. 3 shows an example of a structure in which every two neighboring resonators of the ladder-type circuit shown in FIG. 2 are combined into one. In FIG. 3, a series-arm resonator S23 is formed by combining the series-arm resonators S2 and S3 of FIG. 2, a parallel-arm resonator P12 is formed by combining the parallel-arm resonators P1 and P2 of FIG. 2, and a parallel-arm resonator P34 is formed by combining the parallel-arm resonators P3 and P4 of FIG. 2. Here, so as not to change the impedance in the equivalent circuit before and after the combining of the resonators, the capacitance of the combined series-arm resonator S23 is halved, and the capacitance of each of the combined parallel-arm resonators P12 and P34 is doubled.

Japanese Unexamined Patent Publication No. 10-303698 (hereinafter referred to as "Prior Art 1") discloses an example improvement in designs to increase the power durability of a multi-stage ladder filter. As shown in FIG. 4, a ladder filter 200 in accordance with the disclosure of Prior Art 1 has two series-arm resonators S1a and S1b connected in series, instead of the single series-arm resonator S1 located at the first stage when seen from the signal input side in FIG. 3.

Although improvements such as the above have been made to obtain higher power durability, currently available ladder filters do not exhibit power durability that is high enough for practical use.

Meanwhile, more and more attention has been drawn to filters using piezoelectric thin-film resonators (the piezoelectric thin-film resonators being hereinafter sometimes referred to simply as "resonators", and the filters with the piezoelectric thin-film resonators being hereinafter sometimes referred to as "piezoelectric thin-film filters"), because those piezoelectric thin-film filters have higher power durability and exhibit better filter characteristics than SAW filters. A piezoelectric thin-film resonator normally includes a substrate and a laminated resonator formed on the substrate. The laminated resonator includes a piezoelectric thin-film and a pair of electrode films that sandwich the piezoelectric thin-film. The laminated resonator having such a structure needs to be acoustically insulated from the substrate. Therefore, there is a cavity formed immediately under the laminated resonator, or there is an acoustic multi-layer film formed by laminating alternately two types of films having different acoustic impedances but both having a thickness of ¼ wavelength.

When an AC voltage is applied to the pair of electrodes in the above structure, the piezoelectric thin-film sandwiched by the electrodes vibrates in the thickness longitudinal direction due to a reverse piezoelectric effect. As a result, the piezoelectric thin-film resonator exhibits electric resonance characteristics. This proves that a single-terminal pair piezoelectric thin-film resonator can be represented by the same equivalent circuit as that of a single-terminal pair SAW resonator, and electrically behaves in the same manner as a single-terminal pair SAW resonator. It is therefore possible to employ a single-terminal pair piezoelectric thin-film resonator, instead of a single-terminal pair SAW resonator, in the above ladder filter.

For the above reasons, a piezoelectric thin-film filter has higher power durability than a SAW filter, but needs to have even higher power durability to be put into practical use. Japanese Unexamined Patent Publication No. 2002-198777 (Prior Art 2) discloses an improvement in the power durability of a ladder filter using a single-terminal pair piezoelectric thin-film resonator in the same manner as that disclosed in Prior Art 1. More particularly, Prior Art 2 discloses a ladder filter using a single-terminal pair piezoelectric thin-film resonator that is formed by connecting two or more resonators in series, instead of using a single series-arm resonator. As an example of such a ladder filter, FIG. 5 shows an equivalent circuit of a structure in which a series-arm resonator on the signal input side is divided into two resonators connected in series. FIG. 6 is a plan view of a ladder filter 300 having the above structure. In FIGS. 1 through 6, like resonators (all the series-arm resonators and parallel-arm resonators) of SAW filters and piezoelectric thin-film filters are denoted by like reference numerals.

When two or more resonators connected-in series are employed instead of a single series-arm resonator, however, the number of resonators increases accordingly, and the area of the divided resonators is larger than the area of the single series-arm resonator, resulting in a larger necessary total area. If a single resonator is divided into n (n being a positive integer), the area of the divided resonators is n times larger than the area of the single resonator, so that the impedance of the divided resonators becomes the same as the impedance of the single resonator. Also, to increase power durability as much as possible, not only the series-arm resonator on the signal input side but also all the other series-arm resonators are often divided. In such a case, the total necessary area of the resonators becomes very large, and hinders decrease of the device size. In a case of a membrane-type piezoelectric thin-film resonator in which a cavity for acoustic insulation from the substrate is formed under each resonator, the piezoelectric thin-film resonator breaks easily as the area of the resonators becomes larger, resulting in a difficult problem of having a poorer yield.

SUMMARY OF THE INVENTION

It is therefore an object of the present invention to provide a filter element and a filter device including the filter element in which the above disadvantage is eliminated.

A more specific object of the present invention is to provide a filter element that has single-terminal piezoelectric thin-film resonators arranged in series arms and parallel arms, prevents increase of device size, enhances power durability, and prevents yield decrease.

Another specific object of the present invention is to provide a filter device, a duplexer, and a high-frequency circuit each including the filter element.

The above objects of the present invention are achieved by a filter element comprising a plurality of resonators that are arranged in series arms and parallel arms in a circuit, at least one of the series-arm resonators including a plurality of single-terminal pair piezoelectric thin-film resonators connected in parallel.

The above objects of the present invention are achieved by a filter element comprising a plurality of resonators that are arranged in series arms and parallel arms in a circuit, at least the series-arm and/or parallel-arm resonators at the first stage on the signal input side including a plurality of single-terminal pair piezoelectric thin-film resonators connected in parallel.

The above objects of the invention are also achieved by a duplexer comprising a transmission filter element and a reception filter element, the transmission filter element including a plurality of resonators that are arranged in series arms and parallel arms in a circuit, at least one of the series-arm resonators including a plurality of single-terminal pair piezoelectric thin-film resonators connected in parallel.

The above objects of the present invention are also achieved by a duplexer comprising a transmission filter element and a reception filter element, the transmission filter element including a plurality of resonators that are arranged in series arms and parallel arms, at least one of the parallel-arm resonators including a plurality of single-terminal pair piezoelectric thin-film resonators connected in parallel.

The above objects of the present invention are also achieved by a high-frequency circuit that transmits and receives radio signals, comprising: a first amplifier that amplifies transmission signals; a second amplifier that amplifies reception signals; and a duplexer that includes a transmission filter element and a reception filter element, the transmission filter element including a plurality of resonators that are arranged in series arms and parallel arms in a circuit, and at least one of the series-arm resonators including a plurality of single-terminal pair piezoelectric thin-film resonators connected in parallel.

The above objects of the present invention are also achieved by a high-frequency circuit that transmits and receives radio signals, comprising: a first amplifier that amplifies transmission signals; a second amplifier that amplifies reception signals; and a duplexer that includes a transmission filter element and a reception filter element, the transmission filter element including a plurality of resonators that are arranged in series arms and parallel arms in a circuit, and at least one of the parallel-arm resonators including a plurality of single-terminal pair piezoelectric thin-film resonators connected in parallel.

The above objects of the present invention are achieved by a high-frequency circuit that transmits radio signals, comprising: an amplifier that amplifies transmission signals; and a filter element that filters the transmission signals, the filter element including a plurality of resonators that are arranged in series arms and parallel arms in a circuit, and at least one of the series-arm resonators including a plurality of single-terminal pair piezoelectric thin-film resonators connected in parallel.

The above objects of the present invention are also achieved by a high-frequency circuit that transmits radio signals, comprising: an amplifier that amplifies transmission signals; and a filter element that filters the transmission signals, the filter element including a plurality of resonator that are arranged in series arms and parallel arms in a circuit, and at least one of the parallel-arm resonators including a plurality of single-terminal pair piezoelectric thin-film resonators connected in parallel.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of preferred embodiments of the present invention, with reference to the accompanying drawings.

First Embodiment

Figure 1:
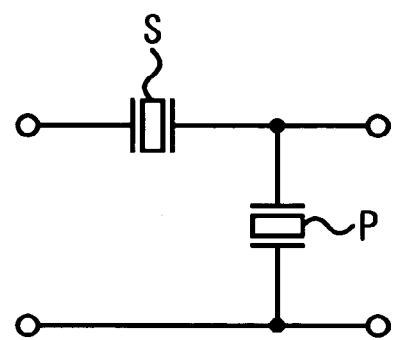
FIG. 1 shows an equivalent circuit of a base section of a filter element having a series-arm resonator and a parallel-arm resonator arranged in a series arm and a parallel arm, respectively.
Figure 2:
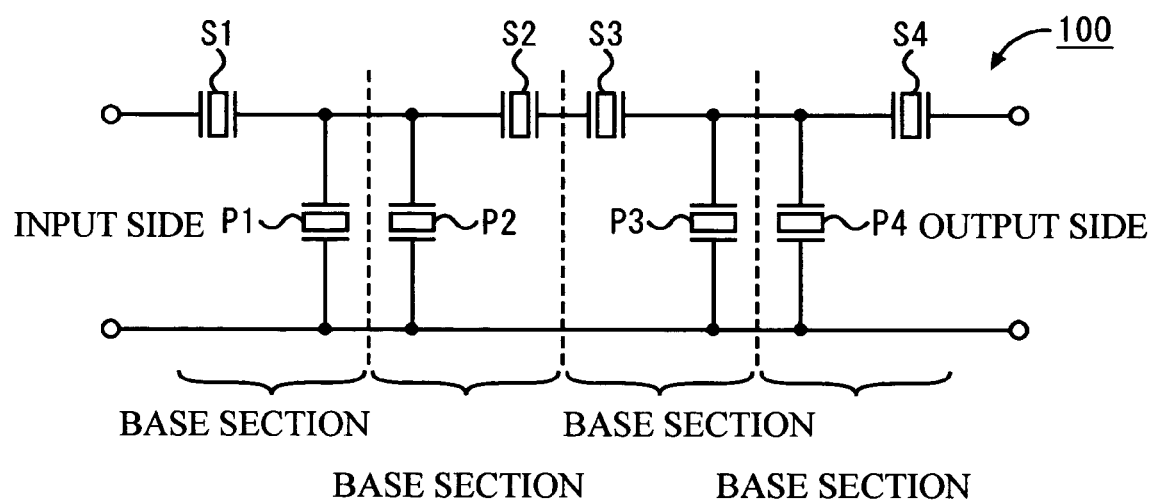
FIG. 2 shows an equivalent circuit of a conventional ladder filter.
Figure 3:
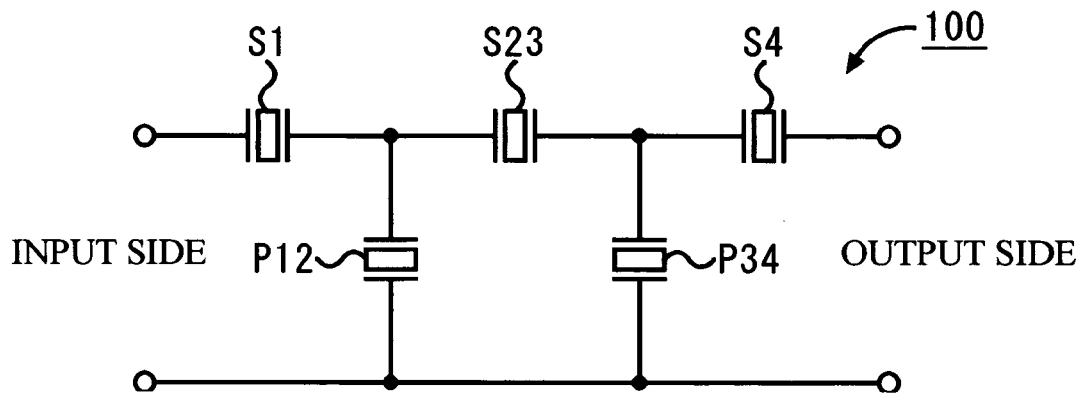
FIG. 3 shows an equivalent circuit of a structure in which each two neighboring series-arm resonators and parallel-arm resonators in the ladder filter of FIG. 2 are combined into one.
Figure 4:
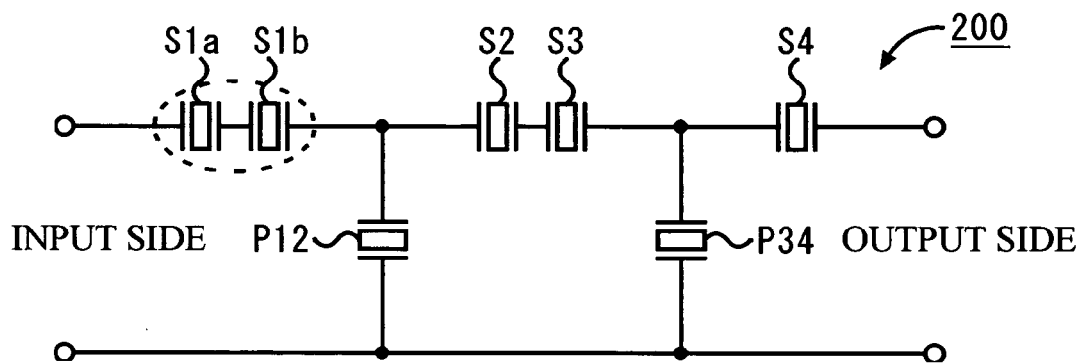
FIG. 4 shows an equivalent circuit of another conventional ladder filter.
Figure 5:
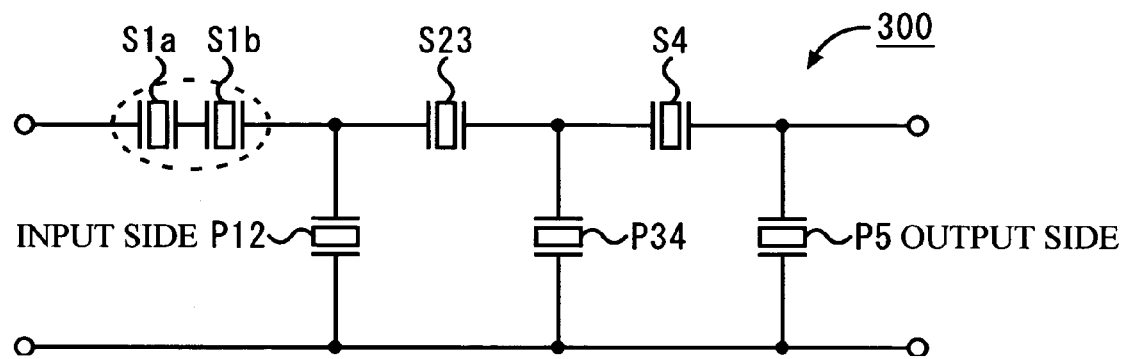
FIG. 5 shows an equivalent circuit of yet another conventional ladder filter.
Figure 6:
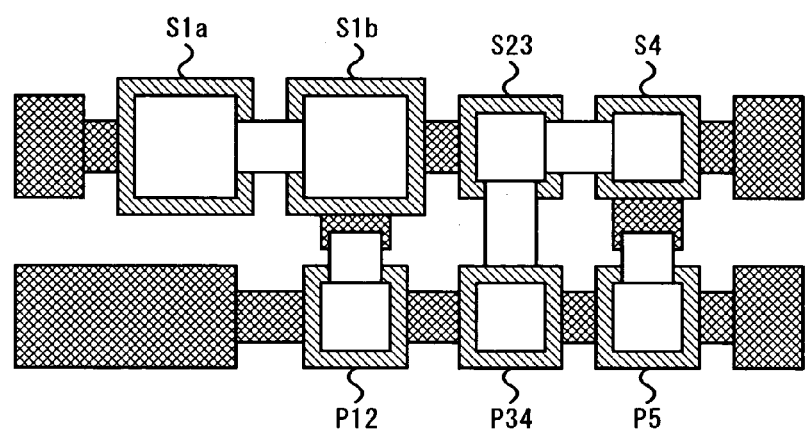
FIG. 6 is a plan view illustrating the filter structure of the ladder filter of FIG. 5.
Figure 7:
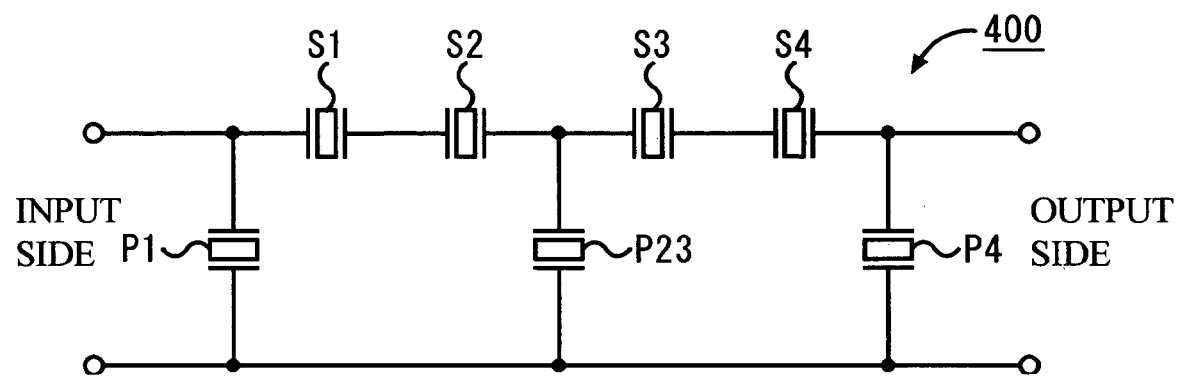
FIG. 7 shows an equivalent circuit of a ladder filter as a comparative example.
Figure 8:
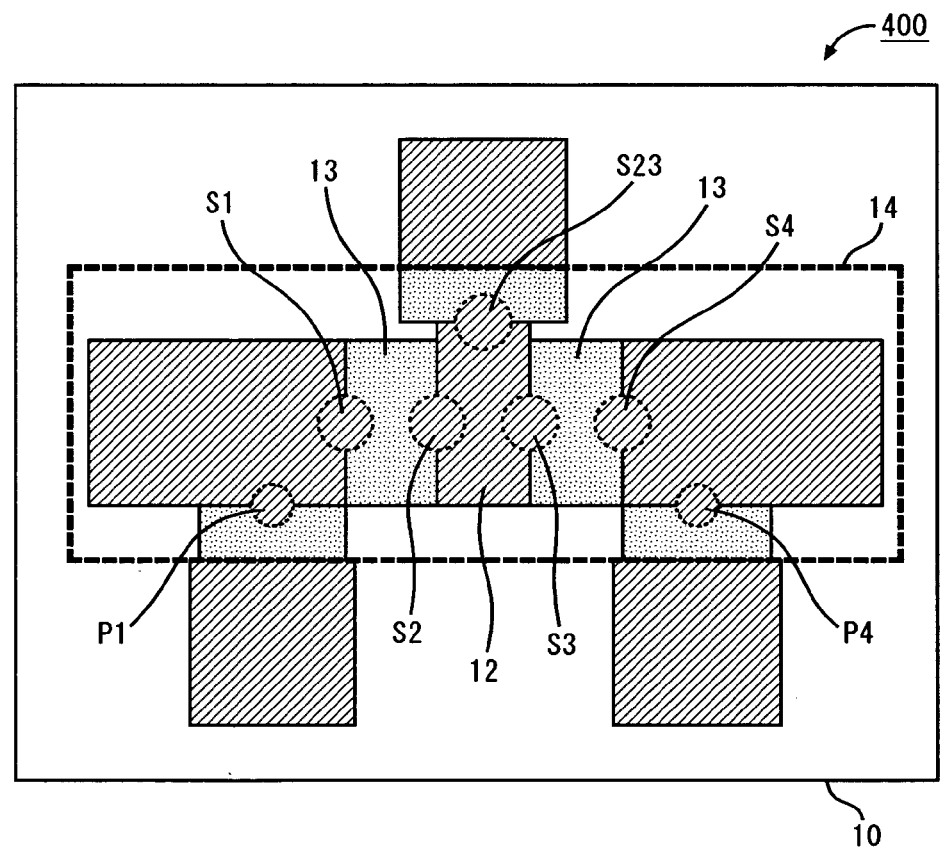
FIG. 8 is a plan view illustrating the filter structure of the ladder filter of FIG. 7.

A first embodiment of the present invention will now be described in detail. FIG. 7 shows an equivalent circuit of a ladder filter 400 having only single-terminal pair piezoelectric thin-film resonators (hereinafter referred to simply as "resonators") as a comparative example. FIG. 8 is a plan view illustrating the filter structure of the ladder filter 400. In this comparative example, there are four stages of ladder-type circuit base sections, and the two parallel resonators in the middle are combined into one in the same manner as in the conventional example shown in FIG. 3.

Figure 9:
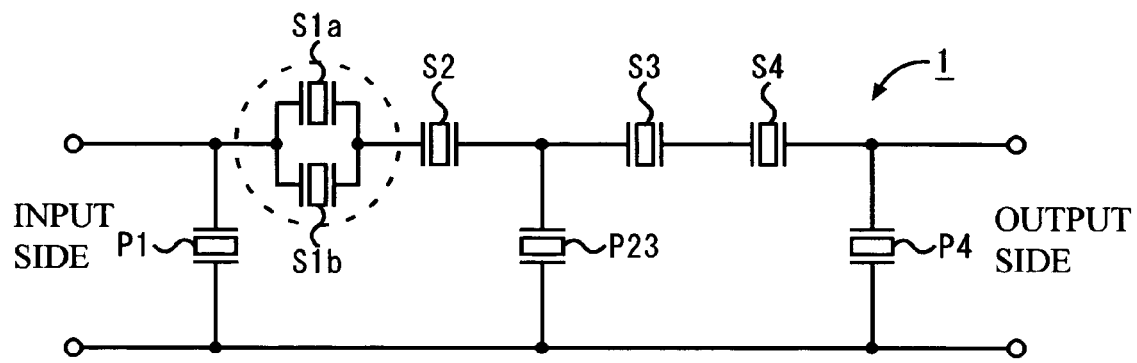
FIG. 9 shows an equivalent circuit of a ladder filter in accordance with a first embodiment of the present invention.
Figure 10:
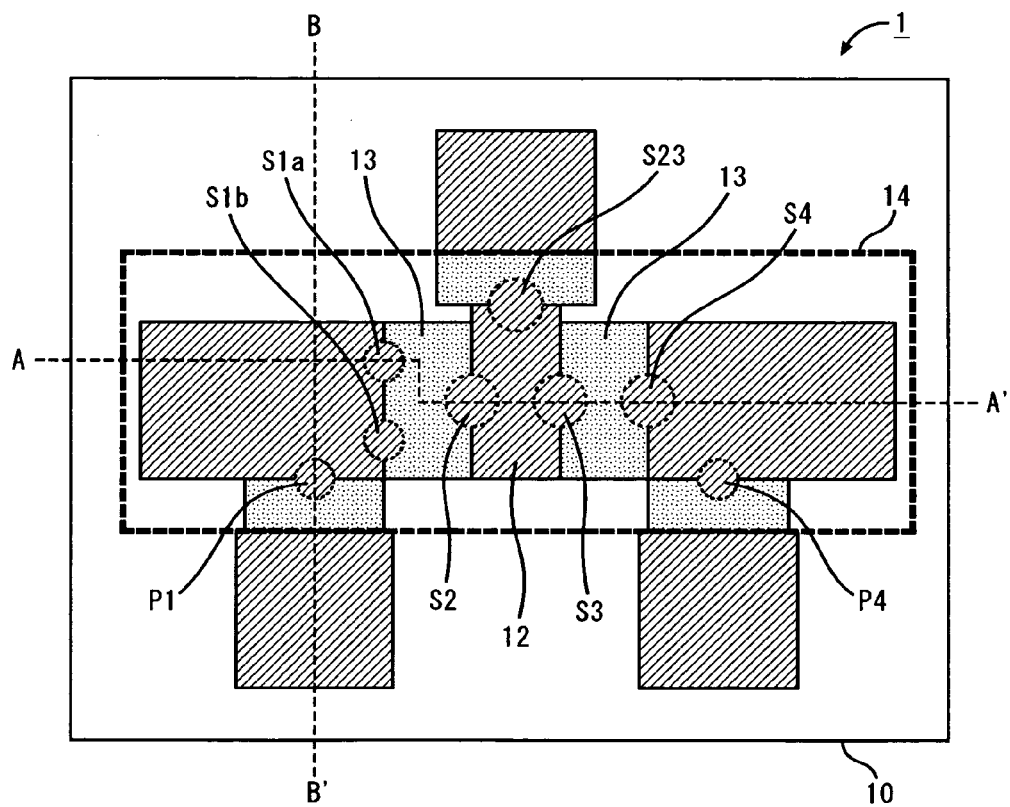
FIG. 10 is a plan view illustrating the filter structure of the ladder filter of FIG. 9.
Figure 11A:
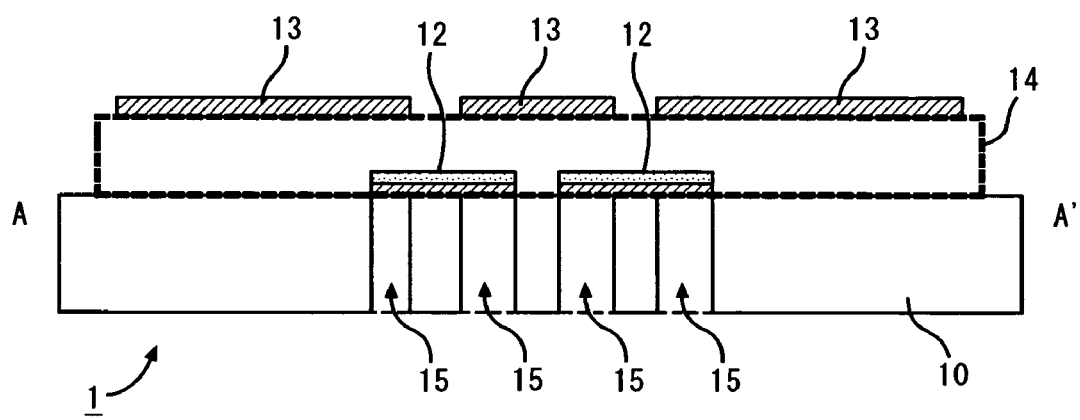
FIG. 11A is a section view of the filter structure of the ladder filter, taken along the line A–A' of FIG. 10.
Figure 11B:
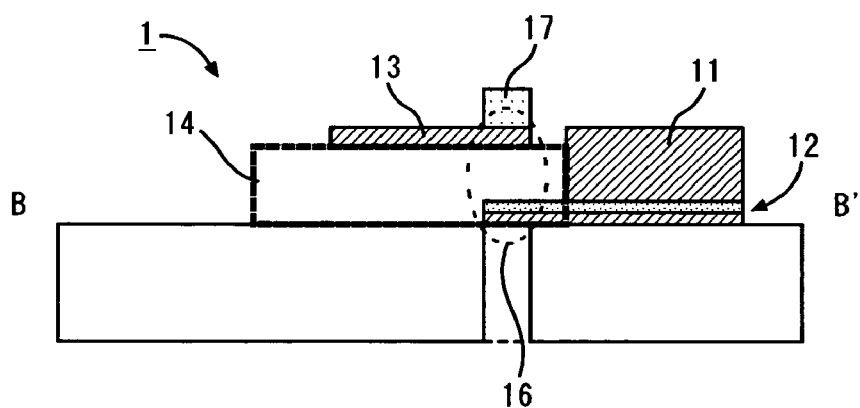
FIG. 11B is a section view of the filter structure of the ladder filter, taken along the line B–B' of FIG. 10.

As the first embodiment of the present invention as opposed to the comparative example, FIG. 9 shows an equivalent circuit of a ladder filter 1 in which only the first-stage series-arm resonator on the signal input side is divided into two resonators connected in parallel. FIG. 10 is a plan view illustrating the filter device of the ladder filter 1. FIG. 11A is a section view of the filter structure, taken along the line A–A' of FIG. 10, and FIG. 11B is a section view of the filter structure, taken along the line B–B' of FIG. 10. The resonators S1$a$, S1$b$, S2 through S4, P1, P23, and P4 in this filter structure are membrane-type piezoelectric thin-film resonators, and form a 5-GHz-band filter.

In the structure shown in FIG. 10 and FIGS. 11A and 11B, a substrate 10 is a silicon (Si) single-crystal substrate, and lower electrode films are double-layer films of molybdenum (Mo) and aluminum (Al). A piezoelectric thin-film 14 is a single-layer film of aluminum nitride (AlN), and upper electrode films 13 are Mo single-layer films. A cavity 15 is formed through the substrate 10 immediately under each overlapping region of the upper electrode films 13 and the lower electrode films 12, as shown in FIGS. 11A and 11B. Each cavity 15 has substantially the same size as each of the overlapping regions. To obtain bandpass filter characteristics through matching the resonant frequencies of the series-arm resonators with the antiresonant frequencies of the parallel-arm resonators, laminated resonator bodies 16 that form the parallel-arm resonators P1, P23 and P4 have SiO$_2$ films 17 on the upper electrode films 13, as shown in FIG. 11B. Further, also as shown in FIG. 11B, bump-forming pads formed by conductive layers 11 are provided in the bump regions on the lower electrode films 12 on which bumps are to be formed. Those conductive layers 11 may be located in wiring regions for connecting the pads to the series-arm and parallel-arm resonators, or between the series-arm resonators, or in wiring regions for connecting the series-arm resonators to the parallel-arm resonators. At least, the conductive layers 11 are not formed in regions on the laminated resonator bodies of the resonators.

In this embodiment, the materials for the series-arm resonators and the parallel-arm resonators are as follows. The substrate 10 may be made of silicon (Si), glass, ceramics, or the like. The piezoelectric thin-film 14 may be made of any material, as long as a thin film can be formed with the material, such as aluminum nitride (AlN), zinc oxide (ZnO), lead zirconate titanate (PZT), lead titanate (PbTiO$_3$), or the like. The upper electrode films 13 and the lower electrode films 12 are metal single-layer films or laminated films made of aluminum (Al), copper (Cu), gold (Au), molybdenum (Mo), tungsten (W), tantalum (Ta), chromium (Cr), titanium (Ti), platinum (Pt), ruthenium (Ru), rhodium (Rh), or the like.

In this filter structure, the combined impedance (admittance) of the two divided series-arm resonators S1$a$ and S1$b$ connected in parallel is matched with the impedances (admittances) of the other series-arm resonators S2 through S4. By doing so, impedance (admittance) matching can be performed among the base sections of the four-stage structure. Each of the two divided series-arm resonators has a size half the size of the original series-arm resonator (for example, S1). That is, the whole size of the two divided series-arm resonators is equal to the size of the original series-arm resonator, so that no impedance change does not take place before and after the dividing. Thus, the power durability can be improved without maintaining impedance matching and changing the filter performance. When the original series-arm resonator is divided into n, each of the n divided series-arm resonators has a size equal to 1/n of the original size.

The exciting part of each resonator (i.e., each region sandwiched between one of the upper electrode films 13 and one of the lower electrode films 12: the portion below the lower electrode film in the region is acoustically isolated from the substrate) may have a round shape, for example. In the comparative example shown in FIG. 8, each of the series-arm resonators S1 through S4 is 77 µmφ in size, each of the end parallel-arm resonators P1 and P4 is 52 µmφ, and the center parallel-arm resonator P23 is 73 µmφ. In this embodiment shown in FIG. 10, each of the two divided series-arm resonators S1$a$ and S1$b$ connected in parallel has an area that is approximately half as large as the area of the corresponding single series-arm resonator of the comparative example shown in FIG. 8 (the series-arm resonator S1 being 77 µmφ), which is 54 µmφ. More preferably, the divided series-arm resonators S1a and S1b connected in parallel are uniform in size. The other resonators of this embodiment have the same sizes of the corresponding resonators of the comparative example. Each divided resonator has the same power durability, so that the highest power durability of the group of divided resonators can be obtained. Further, the identical sizes of the divided resonators improves the degree of freedom in layout on the chip and product reliability.

Figure 12:
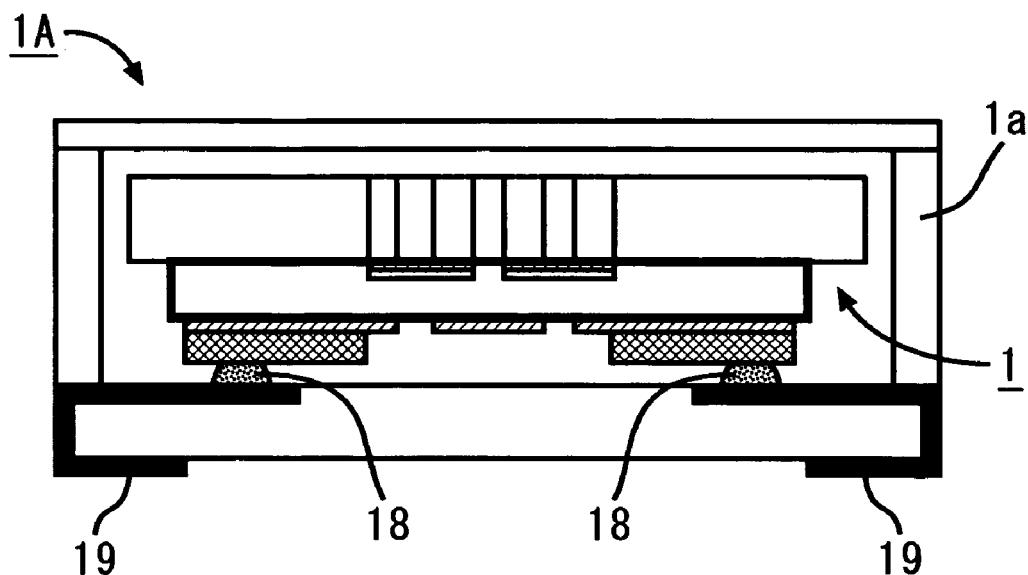
FIG. 12 is a section view illustrating the structure of a filter device having the ladder filter of the first embodiment housed in a ceramic package.

FIG. 12 illustrates a filter device 1A in which the above ladder filter 1 is flip-chip mounted to a ceramic package 1a in a face-down state. In FIG. 12, the ladder filter 1 mounted to the ceramic package 1a has a structure having bumps 18 that are made of gold (Au), copper (C), aluminum (Al), or the like, and are formed in the conductive films 11 on the lower electrode films 12. In this structure, the ladder filter 1 is connected to wires 19 of the ceramic package 1a via the bumps 18. A filter device 400A having the ladder filter 400 of the comparative example flip-chip mounted to a ceramic package also has the same structure as the filter device 1A, and therefore, the filter device 400A is not shown in a drawing.

Figure 13:
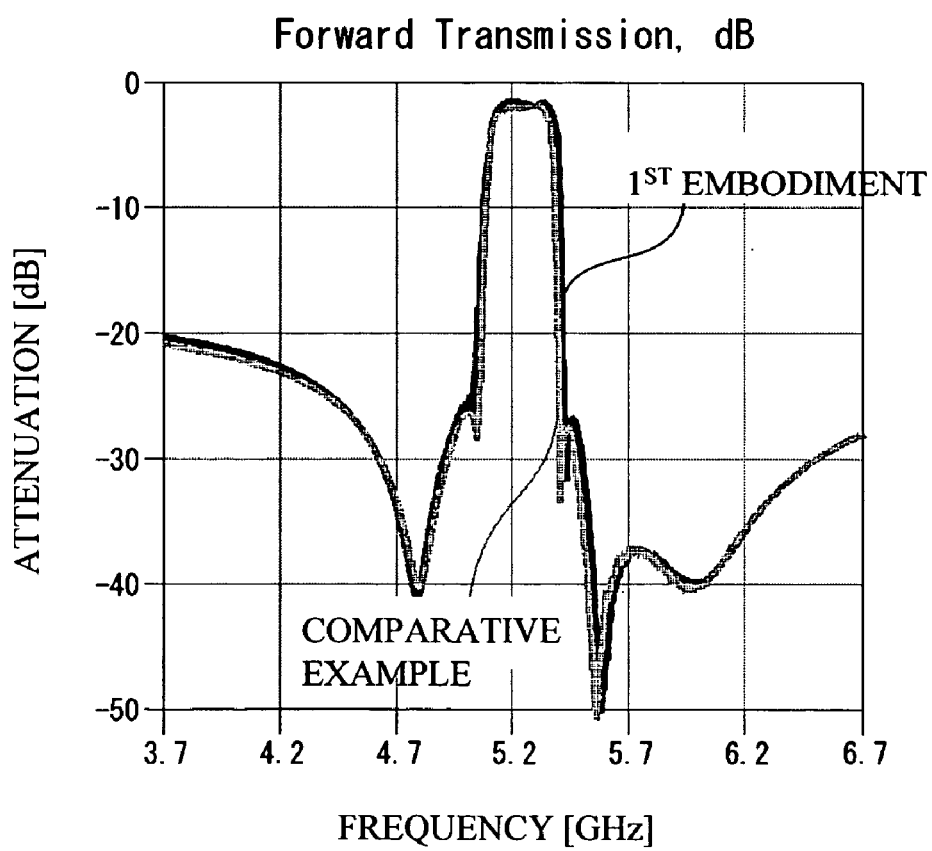
FIG. 13 is a graph showing the filter characteristics of a filter device of a comparative example and a filter device of the first embodiment of the present invention.

FIG. 13 shows the results of evaluations carried out on the filter characteristics of the two samples of the comparative example and this embodiment, which are the filter devices 400A and 1A. As is apparent from FIG. 13, the characteristics of the two samples are substantially the same. Although the exciting part of each resonator is round in shape as described above, the shape of the exciting part is not limited to that, and may be square, rectangular, oval, or the like. Also, the size of each resonator mentioned above is a mere example that can be employed in a 5-GHz-band filter, and may be arbitrarily changed in accordance with desired characteristics.

Figure 14:
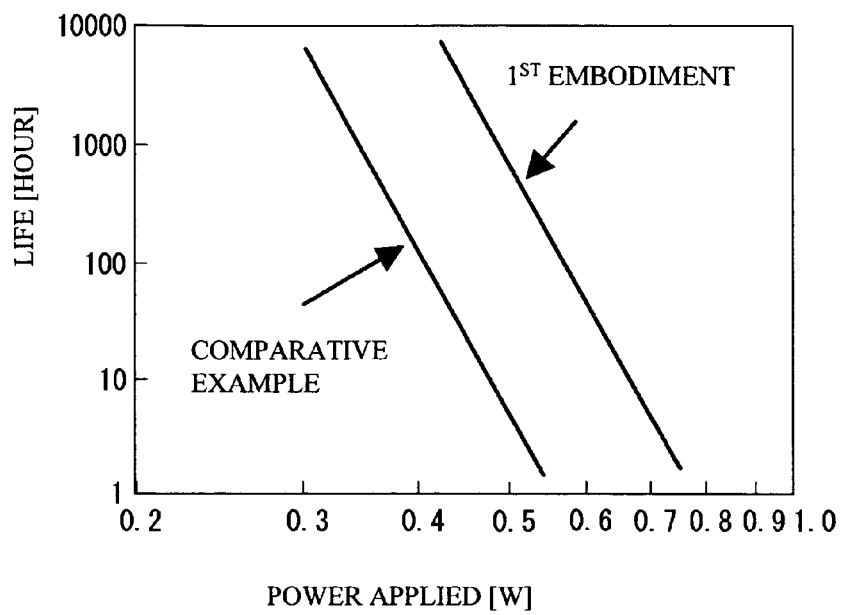
FIG. 14 shows the results of life tests conducted on the filter device of the comparative example and the filter device of the first embodiment of the present invention.

The power durability of each of the two samples of the above comparative example and this embodiment will now be described. Power durability evaluations were carried out through power application to the highest frequency end at which the lowest power durability in the 3 dB band of each filter was measured at an environment temperature of 70° C., thereby evaluating the lives of the samples. FIG. 14 shows the results of the live tests. As is apparent from FIG. 14, the sample of this embodiment has a life 100 times as long as the life of the sample of the comparative example at one point. This proves that the filter structure of this embodiment is very effective in increasing of the power durability.

As described above, when the single resonator is replaced by n piezoelectric thin-film resonators connected in parallel, each of the divided resonators has a size equal to 1/n of the size of the original resonator. Thus, the area occupied by the resonator can be reduced as compared to the conventional connecting way. The above replacement has a size that provides a satisfactory strength in the membrane type piezoelectric thin film resonator. Thus, good production yield can be obtained. The parallel connection of multiple resonators rather than the single resonator greatly improves the power durability.

With the above filter structure of this embodiment, a filter device that includes a filter element of a ladder-type circuit structure having single-terminal pair film resonators arranged in series arms and parallel arms with higher power durability can be obtained without increase in device size or decrease in yield.

Second Embodiment

Another example structure of the ladder filter 1 of the first embodiment will now be described below, with reference to the accompanying drawings.

Figure 15:
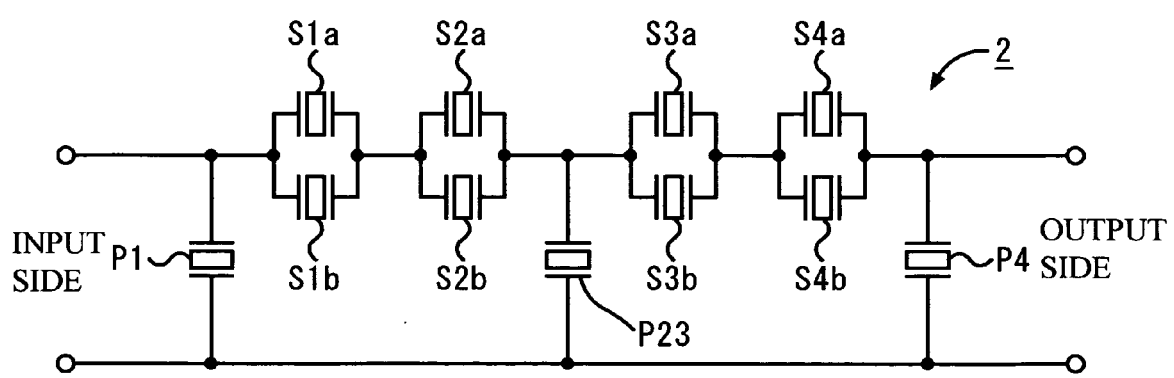
FIG. 15 shows an equivalent circuit of a ladder filter in accordance with a second embodiment of the present invention.

FIG. 15 shows an equivalent circuit of a ladder filter 2 in which every series-arm resonator is divided into two resonators connected in parallel. In this filter, the divided series-arm resonators (S1a, S1b, S2a, S2b, S3a, S3b, S4a, and S4b) are uniform in size, each having an area of 54 µmφ, which is approximately half as large as the area (77 µmφ) of each of the single series-arm resonators S1 through S4 of the comparative example. The other aspects of this structure are the same as those of the first embodiment, and therefore, explanation of them is omitted herein.

Figure 16:
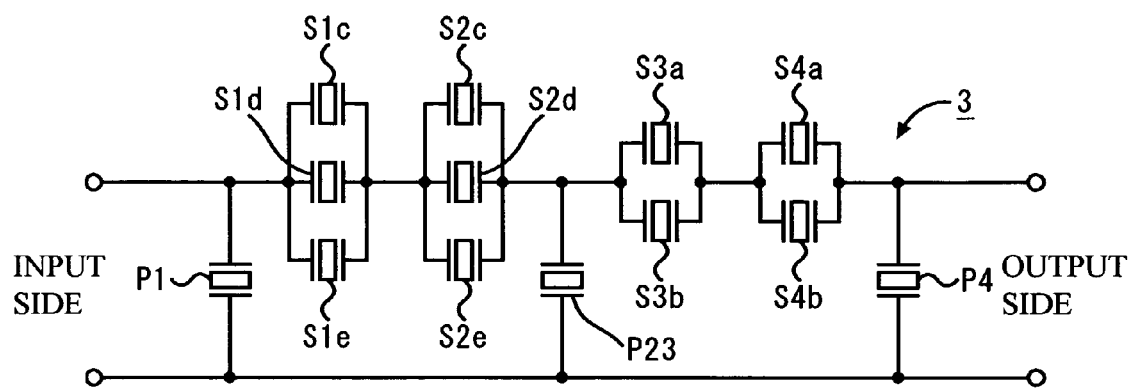
FIG. 16 shows an equivalent circuit of another ladder filter in accordance with the second embodiment of the present invention.

FIG. 16 shows an equivalent circuit of a ladder filter 3 in which each of the first-stage and second-stage series-arm resonators on the signal input side is divided into three resonators connected in parallel, and each of the third-stage and fourth-stage series-arm resonators is divided into two resonators connected in parallel. In this ladder filter 3, the three divided series-arm resonators S1c through S1e connected in parallel, and the three divided series-arm resonators S2c through S2e also connected in parallel, are uniform in size, each having an area of 44 µmφ, which is approximately one third of the area (77 µmφ) of each of the single series-arm resonators S1 through S4 of the comparative example. The two divided series-arm resonators S3a and S3b connected in parallel, and the other two divided series-arm resonators S4a and S4b connected in parallel, are also uniform in size, each having an area of 54 µmφ, which is approximately half as large as the area (77 µmφ) of each of the single series-arm resonators S1 through S4 of the comparative example. The other aspects of this structure are the same as those of the first embodiment, and therefore, explanation of them is omitted herein.

Figure 17:
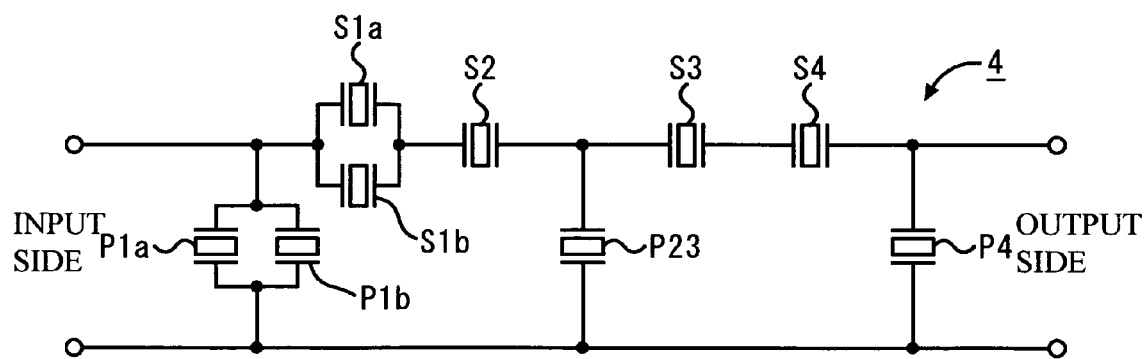
FIG. 17 shows an equivalent circuit of yet another ladder filter in accordance with the second embodiment of the present invention.

FIG. 17 shows an equivalent circuit of a ladder filter 4 in which each of the first-stage series-arm resonator and the first-stage parallel-arm resonator on the signal input side is divided into two resonators connected in parallel. In this structure, the two divided series-arm resonators S1a and S1b connected in parallel are uniform in size, each having an area of 54 µmφ, which is approximately half as large as the area (77 µmφ) of the single series-arm resonator S1 of the comparative example. Likewise, the two divided parallel-arm resonators P1a and P1b connected in parallel are uniform in size, each having an area of 37 µmφ, which is approximately half as large as the area (52 µmφ) of the single parallel-arm resonator P1 of the comparative example. It is to be noted that the amount and path of current in the filter device composed of piezoelectric thin-film resonators arranged in series-arms and parallel-arms change depending on the frequency. For example, current mainly flows through the series-arm resonators at a frequency in the pass band, and mainly flows through the parallel-arm resonators at another frequency. According to the second embodiment, not only the series arms but also the parallel arms are composed of multiple resonators connected in parallel. Thus, the power durability can be improved over the pass band. The other aspects of this structure are the same as those of the first embodiment, and therefore, explanation of them is omitted herein.

Figure 18:
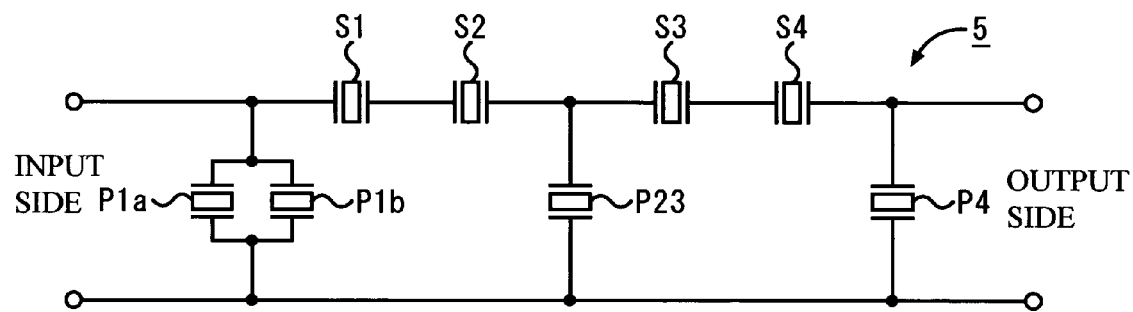
FIG. 18 shows an equivalent circuit of still another ladder filter in accordance with the second embodiment of the present invention.

FIG. 18 shows an equivalent circuit of a ladder filter 5 in which only the first-stage parallel-arm resonator on the signal input side is divided into two resonators connected in parallel. In this structure, the two divided parallel-arm resonators P1a and P1b connected in parallel are uniform in size, each having an area of 37 μmφ, which is approximately half as large as the area (52 μmφ) of the single parallel-arm resonator P1 of the comparative example. The first-stage series-arm resonator on the signal input side that is divided into two resonators connected in parallel in the first embodiment remains the single series-arm resonator S1 in this structure. The aforementioned change of the current path and magnitude may be affected by some design parameters. Under the above-mentioned situation, resonators in the parallel arms may be most likely to be damaged upon receiving high power. According to the above-mentioned embodiment, the power durability can be improved even under the above-mentioned circumstance.

The other aspects of this structure are the same as those of the first embodiment, and therefore, explanation of them is omitted herein.

The structures of ladder filters in accordance with the present invention are not limited to the above examples. More specifically, it is possible to arrange either a parallel-arm resonator or a series-arm resonator at the first stage on the signal input side. Also, the number of stages of base sections may be other than four. Each two neighboring resonators may be either combined into one or remain two individual resonators. The positions of two or more divided resonators connected in parallel in place of a single resonator, and the number of divided resonators, may be arbitrarily selected. Further, impedance matching is performed among the series-arm resonators and among the parallel-arm resonators, so that impedance (admittance) matching is obtained among the base sections, as in the first embodiment. Particularly, when multiple resonators connected in parallel are arranged in the series-arm and/or parallel arm of the first stage of the filter, the power durability can be improved effectively.

Third Embodiment

In the following, a lattice filter using single-terminal pair film resonators will be described as a third embodiment of the present invention, with reference to the accompanying drawings. In this lattice filter, two or more resonators, instead of a single resonator, are connected in parallel.

Figure 19:
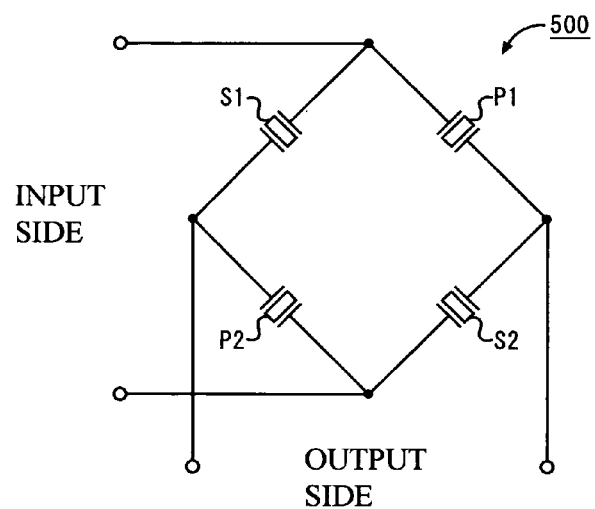
FIG. 19 shows an equivalent circuit of a ladder filter of a comparative example.

FIG. 19 shows an equivalent circuit of a lattice filter 500 as a comparative example. As shown in FIG. 19, the lattice filter 500 has two series arms and two parallel arms. In FIG. 19, the resonators arranged in the series arms (the series-arm resonators) are denoted by S1 and S2, and the resonators arranged in the parallel arms (the parallel-arm resonators) are denoted by P1 and P2.

Figure 20:
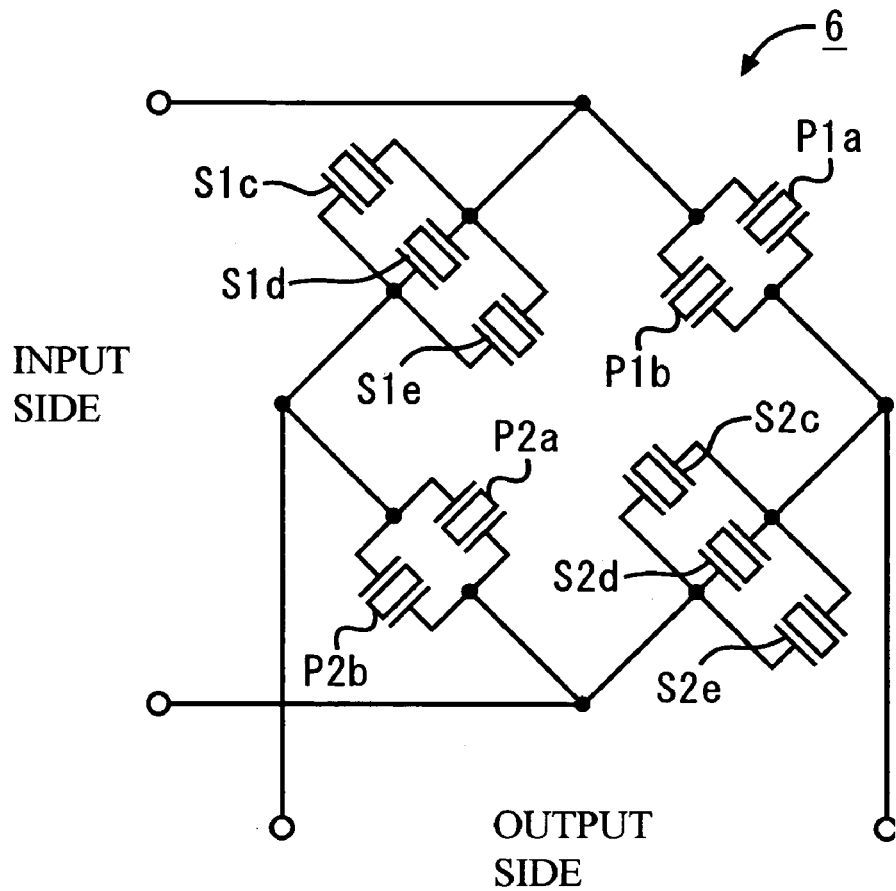
FIG. 20 shows an equivalent circuit of a ladder filter in accordance with a third embodiment of the present invention.

FIG. 20 illustrates a lattice filter 6 in accordance with this embodiment. In this lattice filter 6, each of the series-arm resonators S1 and S2 of the lattice filter 500 is divided into three resonators connected in parallel, and each of the parallel-arm resonators P1 and P2 of the lattice filter 500 is divided into two resonators connected in parallel. Like the ladder filter 1 of the first embodiment, each divisional resonator obtained by dividing a single resonator by n has a size that is approximately 1/n of the area of the single resonator. Also, the number of divisional resonators connected in parallel in place of a single resonator may be arbitrarily selected. The other aspects of this embodiment are the same as those of the first embodiment, and therefore, explanation of them is omitted herein.

With the above structure of the third embodiment of the present invention, a filter device that includes a filter element of a lattice-type circuit structure having single-terminal pair film resonators arranged in series arms and parallel arms with higher power durability can be obtained without increase in device size or decrease in yield.

Fourth Embodiment

In the following, an embodiment utilizing one of the ladder filters and the lattice filter of the foregoing embodiments will be described as a fourth embodiment of the present invention, with reference to the accompanying drawings.

Figure 21:
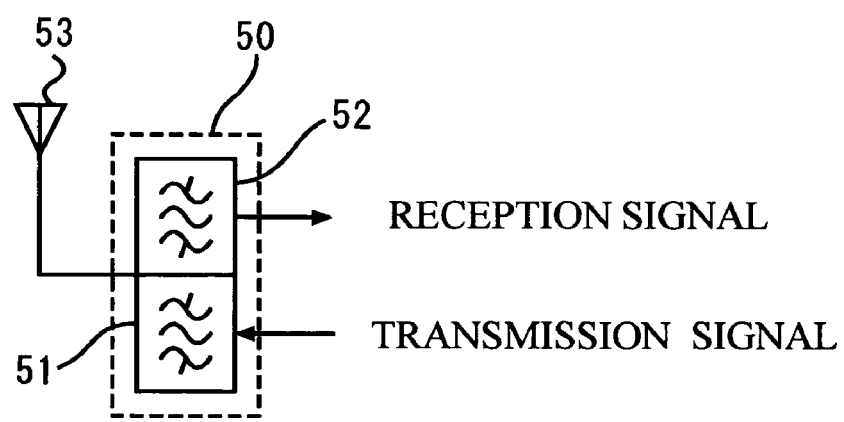
FIG. 21 is a block diagram illustrating the structure of a duplexer in accordance with a fourth embodiment of the present invention.

In general, different frequencies are used for transmission and reception in many cellular systems involving heterodyne transceivers or homodyne transceivers. To separate the transmission signals from the reception signals, a duplexer is employed. FIG. 21 shows a duplexer 50 as an example of such a duplexer. The duplexer 50 includes two filters for transmission and reception: a transmission filter 51 and a reception filter 52. The output side of the transmission filter 51 and the input side of the reception filter 52 shares the same antenna port.

In this cellular system, reception signals that are input through the antenna 53 and pass through the reception filter 52 are of very low power, while high-power transmission signals of W level pass through the transmission filter 51 and are outputted through an antenna 53.

As the filters included in the duplexer 50, ladder filters having single-terminal pair resonators arranged in series arms and parallel arms in a circuit are widely used. In this embodiment, a structure having two or more resonators connected in parallel in place of a single resonator, as described in the foregoing embodiments, is used as the transmission filter 51, so that the duplexer 50 can be highly reliable with high-power transmission signals.

In case high power is applied to the reception filter 52, a structure having two or more resonators connected in parallel in place of a single resonator may also be employed as the reception filter 52, so as to increase the reliability.

Figure 22:
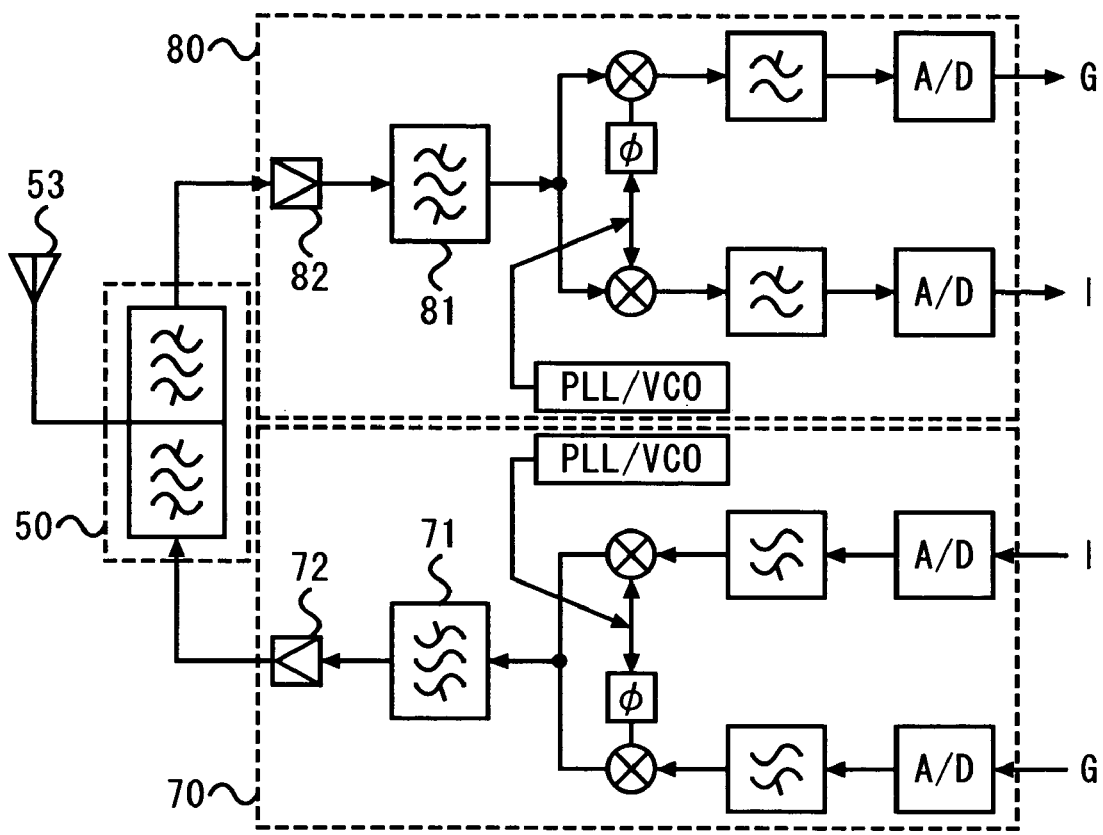
FIG. 22 is a block diagram illustrating the structure of the high-frequency circuit of a homodyne transceiver in accordance with the fourth embodiment of the present invention.

Referring now to FIG. 22, the high-frequency circuit structure of a homodyne transceiver 60 that transmits and receives radio signals will be described.

As shown in FIG. 22, the homodyne transceiver 60 includes a transmitter circuit 70 and a receiver circuit 80, as well as the duplexer 50. The transmitter circuit 70 includes a bandpass filter (BPF) 71 that removes unnecessary signal components, and a power amplifier (PA) 72 that amplifies transmission signals. The receiver circuit 80 includes a low noise amplifier (LNA) 82 that amplifies reception signals, and a bandpass filter (BPF) 81 that removes unnecessary signal components.

Fifth Embodiment

It is possible to employ any of the ladder filters of the first to third embodiments of the present invention for a high-frequency circuit structure of a radio transmission device that transmits radio signals. In the following, a radio transmission device 90 will be described as a fifth embodiment of the present invention, with reference to the accompanying drawing.

Figure 23:
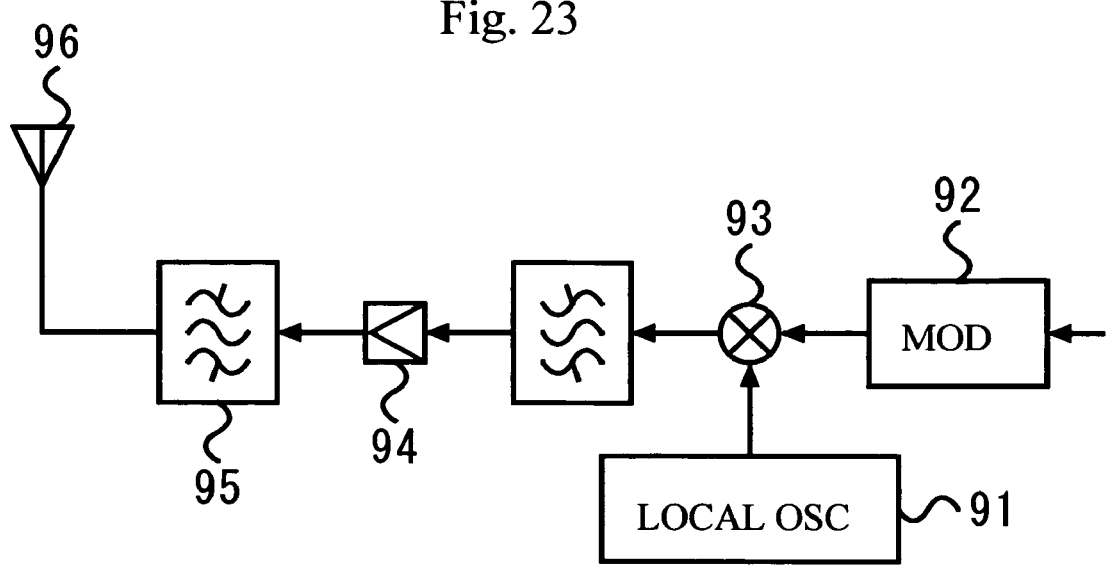
FIG. 23 is a block diagram illustrating the structure of a wireless transmitter device in accordance with a fifth embodiment of the present invention.

FIG. 23 illustrates the high-frequency circuit structure of the radio transmission device 90 of this embodiment. In the radio transmission device 90, a mixer 93 mixes a carrier wave signal transmitted from a local oscillator 91 with a modulated signal transmitted from a modulator 92, and the generated signal is then amplified by a power amplifier (PA) 94. After that, a transmission filter 95 that is one of the ladder filters and the lattice filter of the foregoing embodiments removes unnecessary signal components from the generated signal, which is then outputted through an antenna 96.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A filter element comprising:
    a plurality of resonators that are arranged in series arms and parallel arms in a circuit and have a single piezoelectric thin film common to the plurality of resonators,
    at least one of the series-arm resonators including the series-arm resonator at the first stage on the signal input side being composed of a plurality of single-terminal pair piezoelectric thin-film resonators connected in parallel,
    at least one of the parallel-arm resonators being composed of only one single-terminal pair piezoelectric thin-film resonator.

2. The filter element as claimed in claim 1, wherein at least one of the parallel-arm resonators including the parallel-arm resonator at the first stage is composed of a plurality of single-terminal pair piezoelectric thin-film resonators connected in parallel.

3. The filter element as claimed in claim 2, wherein the parallel-arm resonator including the plurality of single-terminal pair piezoelectric thin-film resonators connected in parallel has an admittance matched with the admittance of at least one of the other parallel-arm resonators.

4. The filter element as claimed in claim 1, wherein:
    the single-terminal pair piezoelectric thin-film resonators include a substrate that contains at least one of silicon, glass, and ceramics;
    the piezoelectric thin film contains at least one of aluminum nitride, zinc oxide, lead zirconate titanate, and lead titanate; and
    an upper electrode film and a lower electrode film that are single-layer or multi-layer films containing at least one of aluminum, copper, gold, molybdenum, tungsten, tantalum, chromium, titanium, platinum, and rhodium.

5. The filter element as claimed in claim 1, wherein the series-arm resonator including the plurality of single-terminal pair piezoelectric thin-film resonators connected in parallel has an admittance matched with the admittance of at least one of the other series-arm resonators.

6. The filter element as claimed in claim 1, wherein the parallel-arm resonators each includes an upper electrode film having a $SiO_2$ film formed thereon.

7. The filter element as claimed in claim 1, wherein the single-terminal pair piezoelectric thin-film resonators connected in parallel have exciting parts that are uniform in size.

8. The filter element as claimed in claim 1, which has a ladder filter structure.

9. The filter element as claimed in claim 1, which has a lattice filter structure.

10. A filter element comprising:
    a plurality of resonators that are arranged in series arms and parallel arms in a circuit,
    only the series-arm and/or parallel-arm resonators at the first stage on the signal input side including a plurality of single-terminal pair piezoelectric thin-film resonators connected in parallel.

11. A filter element comprising:
    a plurality of resonators that are arranged in series arms and parallel arms in a circuit,
    the series-arm resonators at the first stage on the signal input side including more single-terminal pair piezoelectric thin-film resonators connected in parallel than in each of the other series-arm resonators.

12. A filter device comprising:
    a filter element; and
    a package that houses the filter element,
    the filter element including
    a plurality of resonators that are arranged in series arms and parallel arms in a circuit and have a single piezoelectric thin film common to the plurality of resonators,
    at least one of the series-arm resonators including the series-arm resonator at the first stage on the signal input side being composed of a plurality of single-terminal pair piezoelectric thin-film resonators connected in parallel,
    at least one of the parallel-arm resonators being composed of only one single-terminal pair piezoelectric thin-film resonator.

13. A duplexer comprising:
    a transmission filter element and a reception filter element,
    the transmission filter element including a plurality of resonators that are arranged in series arms and parallel arms in a circuit and have a single piezoelectric thin film common to the plurality of resonators,
    at least one of the series-arm resonators including the series-arm resonator at the first stage on the signal input side being composed of a plurality of single-terminal pair piezoelectric thin-film resonators connected in parallel,
    at least one of the parallel-arm resonators being composed of only one single-terminal pair piezoelectric thin-film resonator.

14. A high-frequency circuit that transmits radio signals, comprising:
    an amplifier that amplifies transmission signals; and
    a filter element that filters the transmission signals,
    the filter element including a plurality of resonators that are arranged in series arms and parallel arms in a circuit and have a single piezoelectric thin film common to the plurality of resonators, and
    at least one of the series-arm resonators including the series-arm resonator at the first stage on the signal input side being composed of a plurality of single-terminal pair piezoelectric thin-film resonators connected in parallel,
    at least one of the parallel-arm resonators being composed of only one single-terminal pair piezoelectric thin-film resonator.

15. A high-frequency circuit that transmits and receives radio signals, comprising:
    a first amplifier that amplifies transmission signals;
    a second amplifier that amplifies reception signals; and
    a duplexer that includes a transmission filter element and a reception filter element,
    the transmission filter element including a plurality of resonators that are arranged in series arms and parallel arms in a circuit and have a single piezoelectric thin film common to the plurality of resonators, and
    at least one of the series-arm resonators including the series-arm resonator at the first stage on the signal input side being composed of a plurality of single-terminal pair piezoelectric thin-film resonators connected in parallel,
    at least one of the parallel-arm resonators being composed of only one single-terminal pair piezoelectric thin-film resonator.

\* \* \* \* \*